(12) United States Patent
Dumka

(10) Patent No.: US 10,403,568 B2
(45) Date of Patent: Sep. 3, 2019

(54) MODULE ASSEMBLY

(71) Applicant: Qorvo US, Inc., Greensboro, NC (US)

(72) Inventor: Deep C. Dumka, Richardson, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/796,045

(22) Filed: Oct. 27, 2017

(65) Prior Publication Data

US 2018/0122735 A1     May 3, 2018

Related U.S. Application Data

(60) Provisional application No. 62/413,760, filed on Oct. 27, 2016.

(51) Int. Cl.
*H01L 21/52*     (2006.01)
*H01L 21/56*     (2006.01)
(Continued)

(52) U.S. Cl.
CPC ...... *H01L 23/49827* (2013.01); *H01L 21/486* (2013.01); *H01L 21/52* (2013.01); *H01L 21/561* (2013.01); *H01L 23/49811* (2013.01); *H01L 23/5384* (2013.01); *H01L 23/5389* (2013.01); *H01L 24/24* (2013.01); *H01L 24/47* (2013.01); *H01L 24/82* (2013.01); *H01L 25/18* (2013.01); *H05K 3/3436* (2013.01); *H05K 3/4007* (2013.01); *H01L 23/5386* (2013.01); *H01L 24/16* (2013.01); *H01L 24/48* (2013.01); *H01L 24/73* (2013.01); *H01L 24/92* (2013.01);
(Continued)

(58) Field of Classification Search
CPC ..... H01L 21/52; H01L 21/561; H01L 21/486; H01L 23/49827; H01L 23/5389; H01L 24/82; H01L 24/97; H01L 25/072
See application file for complete search history.

(56) References Cited

U.S. PATENT DOCUMENTS 8,076,699 B2 * 12/2011 Chen .................... H01L 27/0605
257/194
2013/0256884 A1 * 10/2013 Meyer .................... H01L 23/562
257/738

(Continued)

OTHER PUBLICATIONS

Li, Li, et al., "3D SiP with Organic Interposer for ASIC and Memory Integration," 2016 IEEE 66th Electronic Components and Technology Conference, May 31-Jun. 3, 2016, pp. 1445-1450.

(Continued)

*Primary Examiner* — Phat X Cao
(74) *Attorney, Agent, or Firm* — Withrow & Terranova, P.L.L.C.

(57) ABSTRACT

A module assembly includes an adapter substrate with at least one cavity and a surface mounted die mounted on a top surface of the adapter substrate. The first cavity extends through the adapter substrate and has at least one first side wall. A first metallization layer is provided within the cavity. A first recessed die is attached to the first metallization layer and mounted within the cavity such that the first recessed die is at least partially recessed into the first cavity and surrounded by a gap filler that resides between side portions of the first recessed die and the at least one first side wall. The top surface of the gap filler is flush with the top surface of the adapter substrate and a top surface of the first recessed die.

23 Claims, 18 Drawing Sheets

Figure 1:
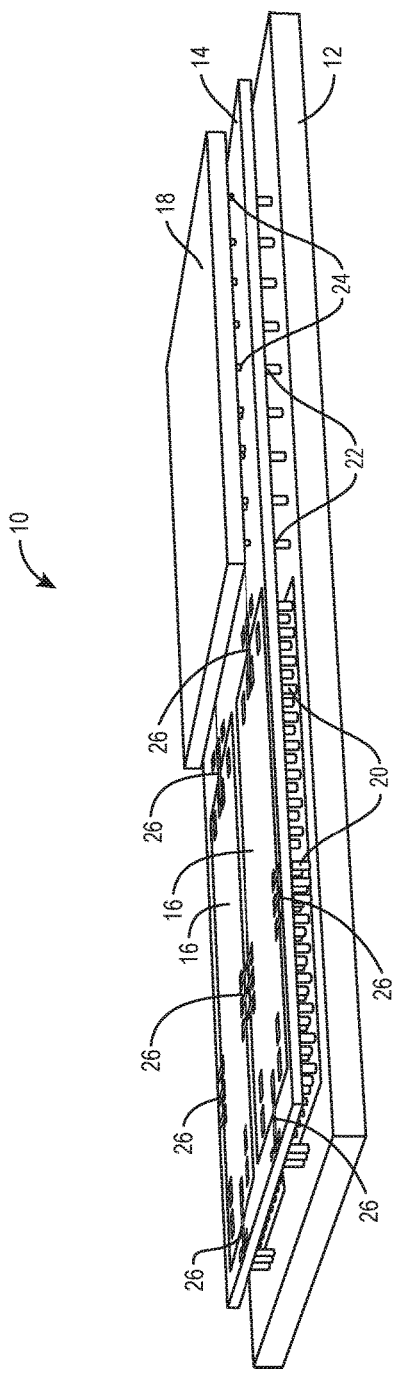
Figure 2:
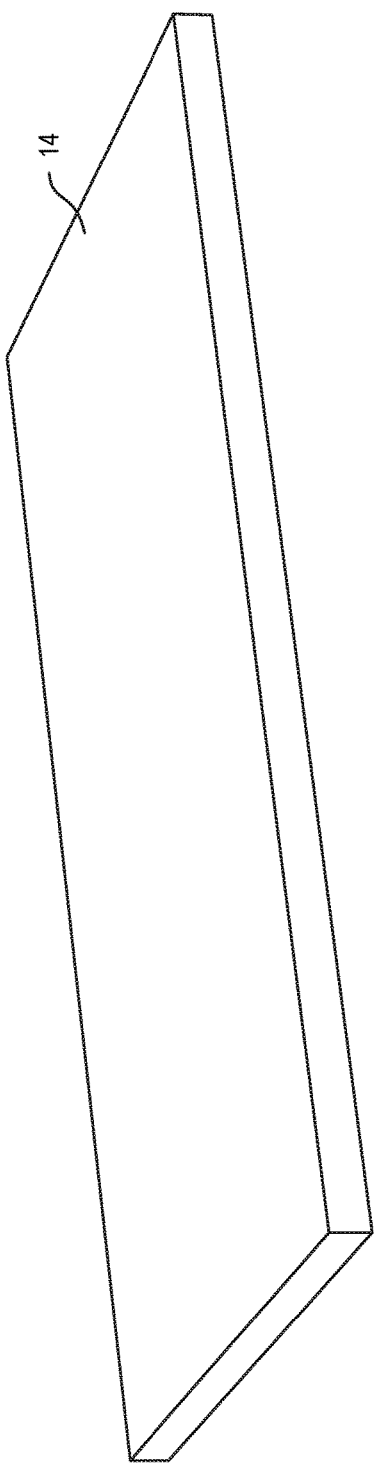

(51) Int. Cl.
*H01L 21/48* (2006.01)
*H01L 23/498* (2006.01)
*H05K 3/34* (2006.01)
*H05K 3/40* (2006.01)
*H01L 23/00* (2006.01)
*H01L 25/18* (2006.01)
*H01L 23/538* (2006.01)

(52) U.S. Cl.
CPC ............. *H01L 2224/16227* (2013.01); *H01L 2224/24227* (2013.01); *H01L 2224/32225* (2013.01); *H01L 2224/48227* (2013.01); *H01L 2224/73265* (2013.01); *H01L 2224/73267* (2013.01); *H01L 2224/92244* (2013.01); *H01L 2224/92247* (2013.01); *H01L 2224/94* (2013.01); *H01L 2224/97* (2013.01); *H01L 2924/1033* (2013.01); *H01L 2924/10253* (2013.01); *H01L 2924/10271* (2013.01); *H01L 2924/10272* (2013.01); *H01L 2924/10329* (2013.01); *H01L 2924/15153* (2013.01); *H01L 2924/15192* (2013.01); *H01L 2924/15311* (2013.01)

(56) References Cited

U.S. PATENT DOCUMENTS

2015/0147845 A1* 5/2015 Poddar ............... H01L 21/6836
438/107
2015/0357272 A1* 12/2015 Shen ................ H01L 23/49827
257/693

OTHER PUBLICATIONS

Ma, Mike, et al., "The development and technological comparison of various die stacking and integration options with TSV Si interposer," IEEE 66th Electronic Components and Technology Conference, May 31-Jun. 3, 2016, pp. 336-334.

Ma, Shenglin, et al., "Process Development of a New TGV Interposer for Wafer Level Package of Inertial MEMS Device," 17th International Conference on Electronic Packaging Technology, Aug. 16-19, 2016, pp. 983-987.

Song, Jinwook, et al., "Active Silicon Interposer Design for Interposer-Level Wireless Power Transfer Technology or High-Density 2.5-D and 3-D ICs," IEEE Transactions on Components, Packaging and Manufacturing Technology, vol. 6, Issue 8, Aug. 2016, pp. 1148-1161.

\* cited by examiner

MODULE ASSEMBLY

RELATED APPLICATIONS

This application claims the benefit of provisional patent application Ser. No. 62/413,760, filed Oct. 27, 2016, the disclosure of which is hereby incorporated herein by reference in its entirety.

FIELD OF THE DISCLOSURE

The present disclosure relates to semiconductor devices and in particular to a module assembly for semiconductor devices.

BACKGROUND

Different semiconductor material systems have different strengths and weaknesses, and as such, often lend themselves to different applications. For example, a silicon-based semiconductor material system lends itself to digital applications and low power analog applications, whereas gallium nitride- and gallium arsenide-based semiconductor material systems lend themselves to high power analog applications, such as radio frequency power amplifiers.

Modern electronics often require circuitry that is formed from different types of semiconductor material systems. For example, today's smart phones include both high and low power analog electronics along with a vast array of digital electronics. Given the continuing effort to add more features in ever decreasing form factors, there is a need for techniques to integrate components that are formed from different types of semiconductor material systems. These techniques must be cost-effective and be able to dissipate heat in an effective manner.

SUMMARY

The present disclosure relates to a module assembly that includes an adapter substrate with at least one cavity and a surface mounted die mounted on a top surface of the adapter substrate. The first cavity extends through the adapter substrate and has at least one first side wall. A first metallization layer is provided within the cavity. A first recessed die is attached to the first metallization layer and mounted within the cavity such that the first recessed die is at least partially recessed into the first cavity and surrounded by a gap filler that resides between side portions of the first recessed die and the at least one first side wall. The top surface of the gap filler is flush with the top surface of the adapter substrate and a top surface of the first recessed die.

In one embodiment, vias extend into the adapter substrate from its top surface, and surface traces reside on the top surface of the adapter substrate, wherein at least one of the vias is electrically connected to at least one other of the vias. Chip-to-chip interconnects extend over the top surface of the gap filler and between a top surface of the first recessed die and at least one of the surface traces or at least one of the vias to facilitate at least one electrical connection between the first recessed die and at least one of the surface traces or at least one of the vias on the adapter substrate. Interconnects may be placed on the backside surface of the adapter substrate, wherein at least a first of the interconnects directly contacts at least one of the vias and at least a second of the interconnects directly contacts the metallization layer. A package substrate is connected to the adapter substrate via the interconnects.

If the cavity does not extend completely through the adapter substrate, a backside metallization layer may be provided on the backside surface of the adapter substrate opposite first metallization layer, wherein a layer of the adapter substrate at the bottom of the cavity resides between the backside metallization layer and the first metallization layer. Interconnects may be placed on the backside metallization layer and the backside surface of the adapter substrate, wherein at least a first of the interconnects directly contacts the backside metallization layer and a second of the interconnects directly contacts at least one of the vias.

In one embodiment, the adapter substrate is formed from a first semiconductor material system, and the first recessed die is formed from a semiconductor material system, which may be similar to or different than the adapter substrate material. Further, the surface mounted die may be formed from a semiconductor material system, which is either similar or different from the semiconductor material system of the recessed die. For example, the semiconductor material system of surface mounted die may be gallium arsenide, gallium nitride or silicon.

Alternatively, the adapter material may be formed from something other than a semiconductor material system, such as a ceramic. For example, the adapter material may be formed from single crystal or polycrystalline silicon carbide, a ceramic material, or diamond, and the recessed die material may be formed from at least one of gallium arsenide and gallium nitride semiconductor materials.

In one embodiment, the module assembly is fabricated by:
 providing an adapter substrate having a backside surface and a top surface opposite the back surface;
 forming a first cavity that extends partially into the adapter substrate from the top surface, the first cavity having a first bottom surface and at least one first side wall;
 forming a first metallization layer on the first bottom surface of the first cavity;
 attaching a first recessed die to the first metallization layer such that the first recessed die is at least partially recessed into the first cavity, wherein a gap is formed between side portions of the first recessed die and the at least one first side wall;
 filling the gap with a gap filler such that a top surface of the gap filler is flush with the top surface of the adapter substrate and a top surface of the first recessed die;
 thinning the adapter substrate from the backside; and
 attaching a surface mounted die to the top surface of the adapter substrate.

In another embodiment, the method of fabrication may further include:
 forming partial vias that extend partially into the adapter substrate from the top surface;
 forming surface traces on the top surface of the adapter substrate, wherein at least one of the partial vias is electrically connected to at least one other of the partial vias; and
 forming chip-to-chip interconnects over the top surface of the gap filler and between a top surface of the first recessed die and at least one of the surface traces or at least one of the partial vias to facilitate at least one electrical connection between the first recessed die and the at least one of the surface traces or at least one of the partial vias on the adapter substrate.

Fabrication of the module assembly may also include:
 forming interconnects on the backside surface of the adapter substrate, wherein at least a first of the interconnects directly contacts at least one of the partial vias and at least a second of the interconnects directly contacts the metallization layer; and connecting the adapter substrate to a top surface of a packaging substrate via the interconnects.

The fabrication method may further include:

forming interconnects on the backside surface of the adapter substrate, wherein at least a first of the interconnects directly contacts at least one of the partial vias and at least a second of the interconnects directly contacts the metallization layer;

connecting the adapter substrate to a top surface of a packaging substrate via the interconnects.

In one embodiment, the adapter substrate is thinned sufficiently to expose at least a portion of the metallization layer and the partial vias. In such an embodiment, fabrication may further include: forming interconnects on the backside surface of the adapter substrate, wherein at least a first of the interconnects directly contacts at least one of the partial vias and at least a second of the interconnects directly connects to an exposed portion of the first metallization layer. A density of the interconnects below the first metallization layer may be higher than a density of the interconnects below the partial vias.

In another embodiment, the adapter substrate is thinned sufficiently to not expose at least a portion of the metallization layer and the partial vias. As such, the fabrication may further include forming a backside metallization layer on the backside surface of the adapter substrate opposite first metallization layer, as well as forming backside partial vias on the backside surface of the adapter substrate opposite to and directly contacting at least some of the partial vias. Interconnects may be formed on the backside metallization layer and the backside surface of the adapter substrate, wherein at least a first of the interconnects directly contacts the backside metallization layer and a second of the interconnects is coupled to at least one of the backside partial vias. A density of the interconnects below the backside metallization layer may be higher than a density of the interconnects below the partial vias.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates a module assembly according to one embodiment.

FIGS. 2-9, 10A-10D, 11, 12A-12B, and 13A-13B are a sequence of figures that graphically illustrate processes for fabricating the module assembly of FIG. 1.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

With reference to FIG. 1, a module assembly 10 is illustrated according to one embodiment. The module assembly 10 includes a packaging substrate 12, an adapter substrate 14, which includes one or more recessed dies 16, and a surface mounted die 18. The adapter substrate 14 is mounted over and electrically and thermally connected to a top surface of the packaging substrate 12 using appropriate interconnects, such as high density interconnects 20 and low density interconnects 22, which may be implemented by high and low density ball grid array (BGA) interconnects, copper pillars, and the like. The surface mounted die 18 is mounted over and electrically connected to a top surface of the adapter substrate 14 using appropriate interconnects, such as micro bump interconnects 24 and the like. Those skilled in the art will recognize various other interconnects and interconnect technology that may be implemented to effectively electrically and/or thermally connect the packaging substrate 12 to the adapter substrate 14 as well as the surface mounted die 18 to the adapter substrate 14. Chip-to-chip interconnects 26 may be used to facilitate electrical connections between the one or more recessed dies 16 as well as between the recessed dies 16 and traces or vias provided on or in the adapter substrate 14, as will be described further below. The traces as provided on or in the adapter substrate 14 will facilitate electrical connections between various components in, on, or attached to the adapter substrate 14.

The concepts described herein allow multiple semiconductor material systems to be combined in a relatively small package wherein the resulting package, which is represented by the module assembly 10, emulates the monolithic integration of such disparate technologies. For example, the recessed dies 16 may be gallium nitride dies in which high power amplifiers are integrated, the surface mounted die 18 may be a gallium arsenide die in which low noise amplifiers that drive the high power amplifiers are integrated or silicon die in which associated digital control, transceiver circuitry, or the like are implemented. To facilitate efficient heat dissipation, the adapter substrate 14 may be formed from yet another technology, such as silicon carbide. This scenario and cited semiconductor material systems are provided merely as an example.

Exemplary semiconductor material systems for the recessed dies 16 and the surface mounted die 18 include, but are not limited to, silicon, silicon carbide, gallium arsenide, gallium nitride, silicon germanium, and the like. The adapter substrate 14 likewise may be formed from various material systems, including, but not limited to silicon, silicon carbide, aluminum nitride, diamond, glass, ceramic materials, and the like. However, silicon carbide is particularly attractive in applications where heat dissipation is important due to the favorable electrical, thermal, and mechanical properties associated with silicon carbide. Notably, the semiconductor material system for a recessed die 16 or surface mounted die 18 is defined herein as the semiconductor material system in which the active components of the recessed dies 16 or surface mounted die 18 are formed.

The materials used for the substrates of such devices may be the same or different than the semiconductor material subsystem in which the active components are formed. For example, a gallium nitride-based recessed die 16 or surface mounted die 18 is considered to employ the gallium nitride semiconductor material system, regardless of whether the recessed die 16 or surface mounted die 18 has a gallium nitride or silicon carbide substrate. The semiconductor material system of the adapter substrate 14 is the semiconductor material system from which the adapter substrate 14 is actually formed.

FIGS. 2 through 13B illustrate one exemplary process for fabricating a module assembly 10 as illustrated in FIG. 1. The process starts with providing a substrate wafer (not shown) on which many adapter substrates 14 will be formed. For clarity, FIG. 2 only illustrates a single adapter substrate 14, wherein dicing of the substrate wafer to separate the adapter substrates 14 is provided in a step further below. In one particular example, the substrate wafer may be any commercial size wafer, such as wafers ranging between 100 mm in diameter to 300 mm in diameter. As noted above, the substrate wafer may be a silicon, silicon carbide, aluminum nitride, diamond, glass, ceramic, or like wafer. For the purposes of this example, assume that the substrate wafer is a silicon carbide substrate wafer. At this point, a typical substrate wafer may be in the range of 100 µm to 1000 µm thick.

Figure 3:
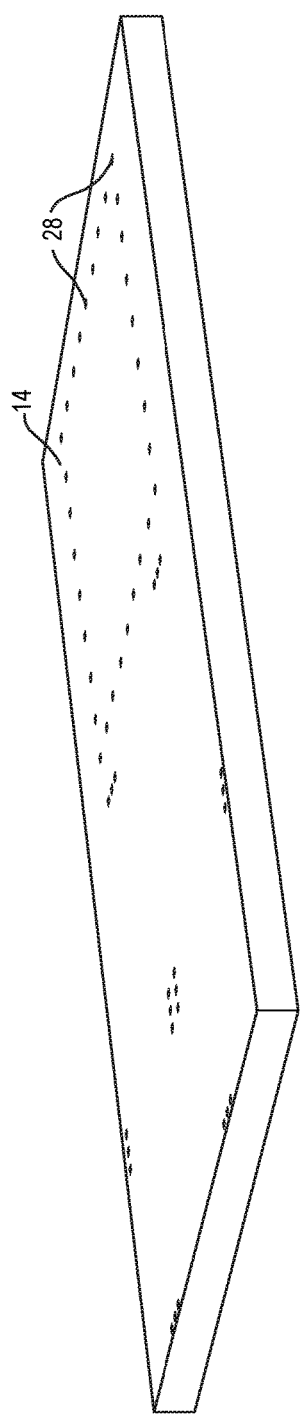

As illustrated in FIG. 3, partial vias 28 are etched in the topside of the wafer and then filled by a metal or other conductive material using an electroplating or like process to form partial vias 28. For clarity, only certain of the partial vias 28 are referenced. Once the partial vias 28 are formed, the top surface of the adapter substrate 14 may be planarized using chemical mechanical polishing (CMP) or the like. If an electroplating process is used to form the partial vias 28, the partial vias 28 may be formed from nickel, copper, aluminum, gold, and the like. In one embodiment, the partial vias 28 have a diameter between 1 µm and 60 µm and a depth of between 100 µm to 200 µm.

Figure 4:
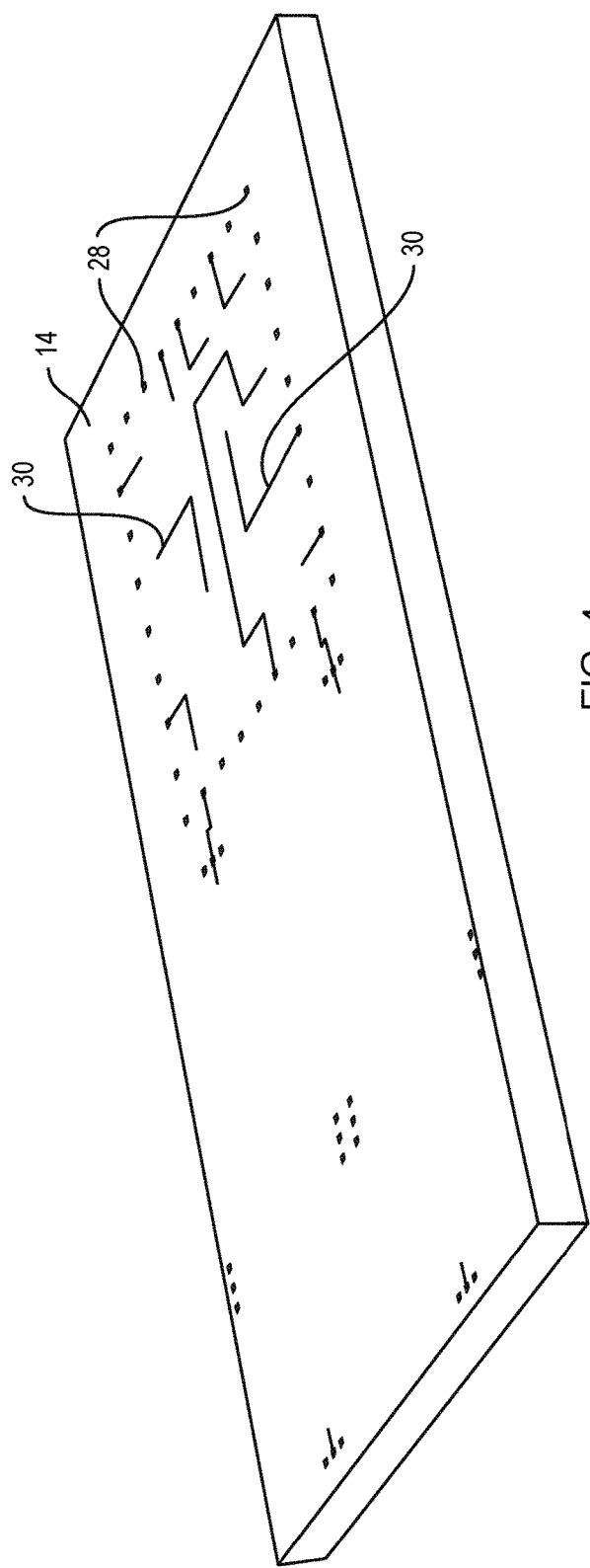

Once the partial vias 28 are formed, surface traces 30 are formed as needed for the circuitry being assembled. Single or multilevel interconnects may be formed by using a combination of appropriate dielectric materials and metallization materials, as illustrated in FIG. 4. The dielectric materials may include benzocyclobutene (BCB), silicon dioxide, silicon nitride, and polymers. The metallization materials may include titanium, tungsten, chromium, nickel, copper, aluminum, and gold, which may be formed using a combination of evaporation, sputtering, electroplating, chemical mechanical polishing (CMP), or other related processes.

Figure 5:
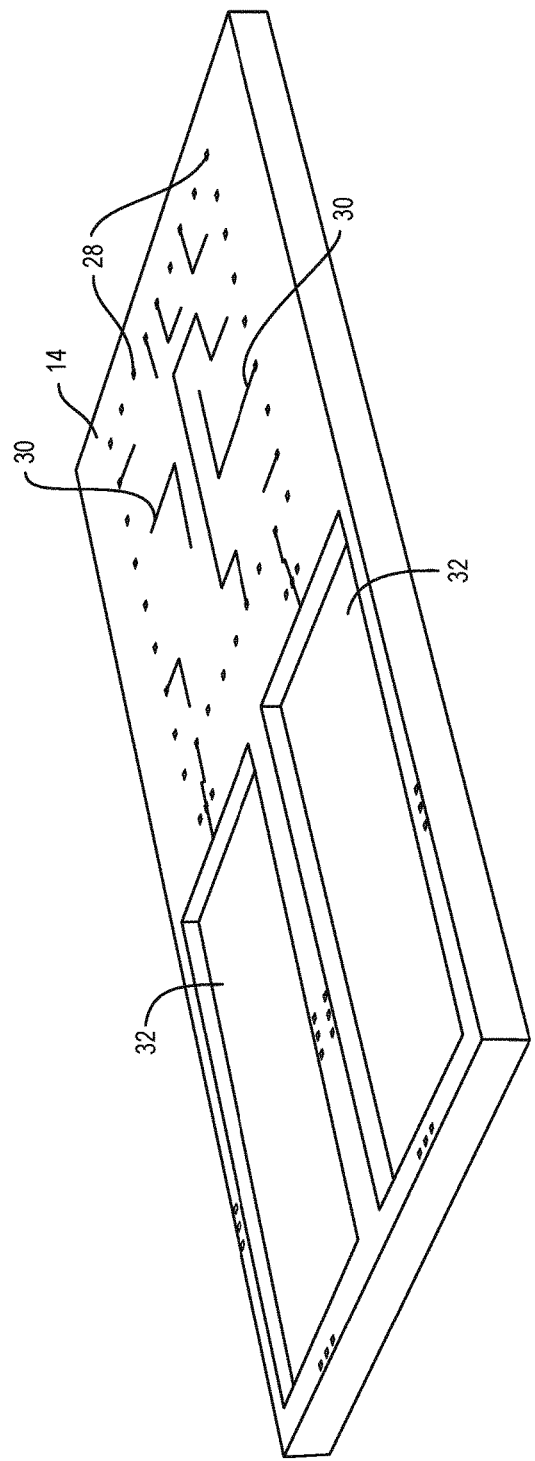

Next, one or more cavities 32 are formed in the top surface of the adapter substrate 14, as illustrated in FIG. 5. The cavities 32 are slightly larger in size than the recessed dies 16 that will be ultimately placed within the cavities 32. The cavities 32 may be formed from one or more lithography and etching processes, as those skilled in the art will appreciate. The depth of the cavities 32 may be between 50 and 200 µm, as one non-limiting example. In certain embodiments, the cavities 32 may extend completely through the adapter substrate 14, as described further below.

Figure 6:
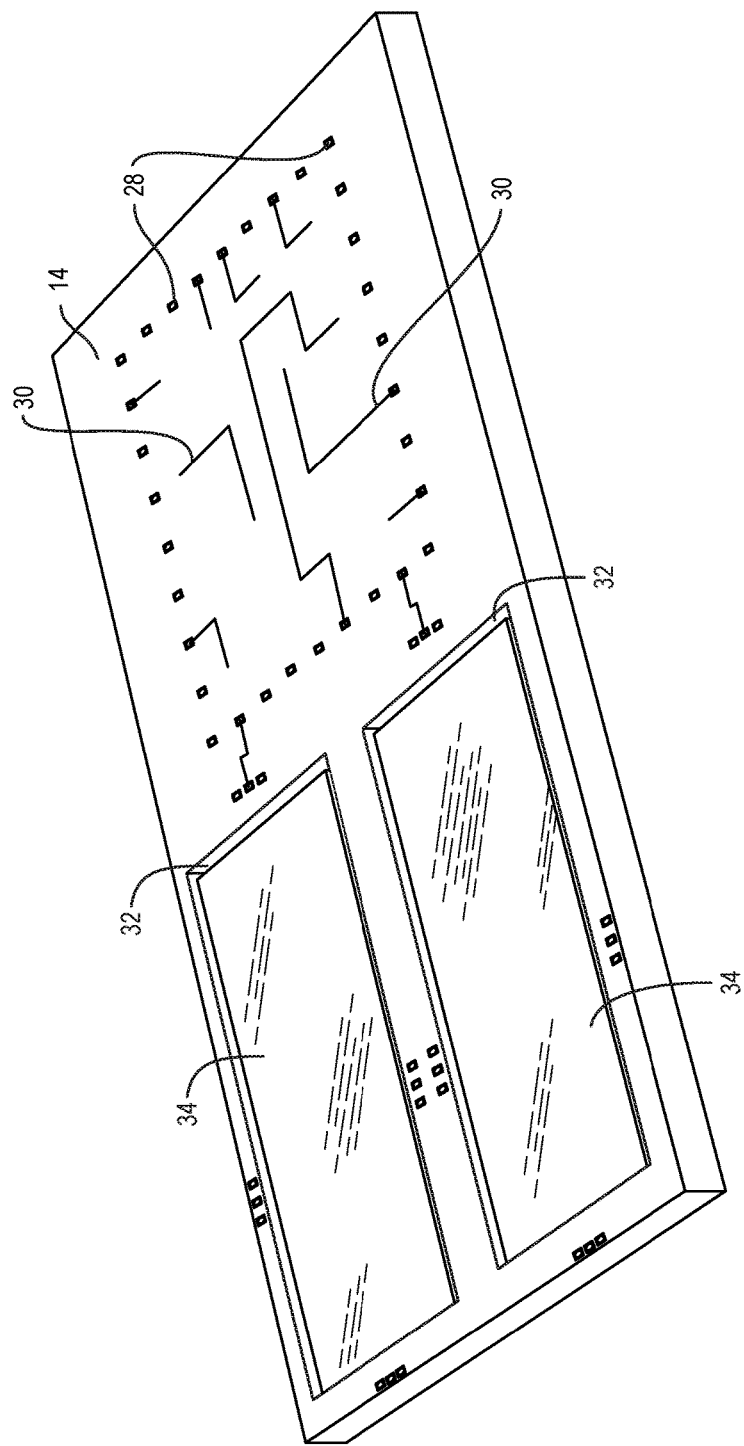

Once the cavities 32 are formed in embodiments where the cavities 32 do not extend completely through the adapter substrate 14, a metallization layer 34 is formed on the bottom surfaces of each of the cavities 32, as illustrated in FIG. 6. The metallization layers 34 may be continuous pads that cover substantially the entirety (at least 80%), if not the entirety (100%), of the bottom surfaces of each of the cavities 32. However, the metallization layer 34 may provide multiple paths, traces, or any combination thereof (not shown) that is required for the circuitry being implemented. The metallization layer 34 may be formed from nickel, gold, copper, aluminum, gold tin (AuSn), gold germanium (AuGe), copper tin (CuSn), and the like. In one embodiment, the thickness of the metallization layer 34 may range from 5 µm to 50 µm.

Figure 7:
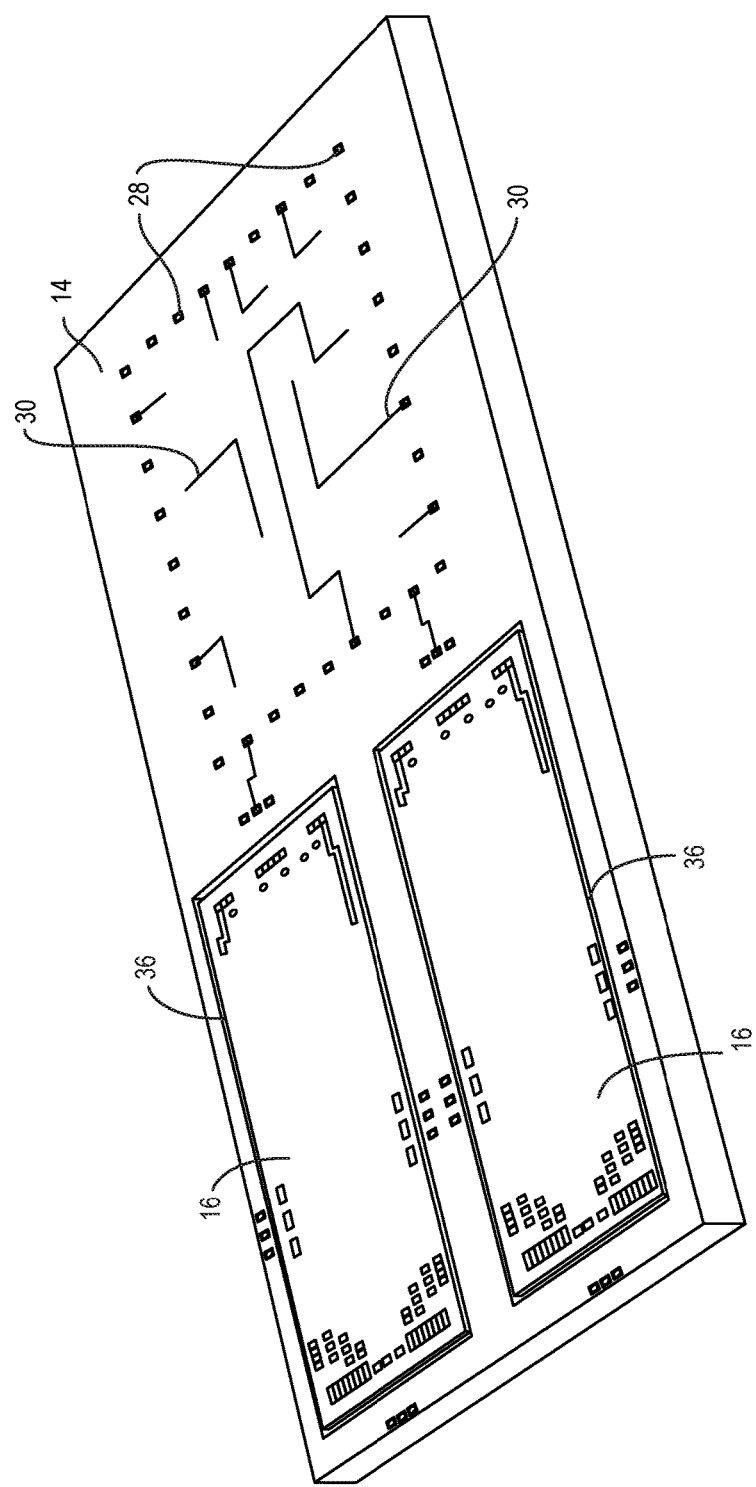

As illustrated in FIG. 7, the recessed dies 16 are placed in the cavity 32 and permanently attached to the metallization layer 34 using an appropriate soldering or like connection process for the composition of the metallization layer 34.

Notably, gaps 36 are formed between the sidewalls of the recessed dies 16 and the sidewalls of the cavities 32.

Figure 8:
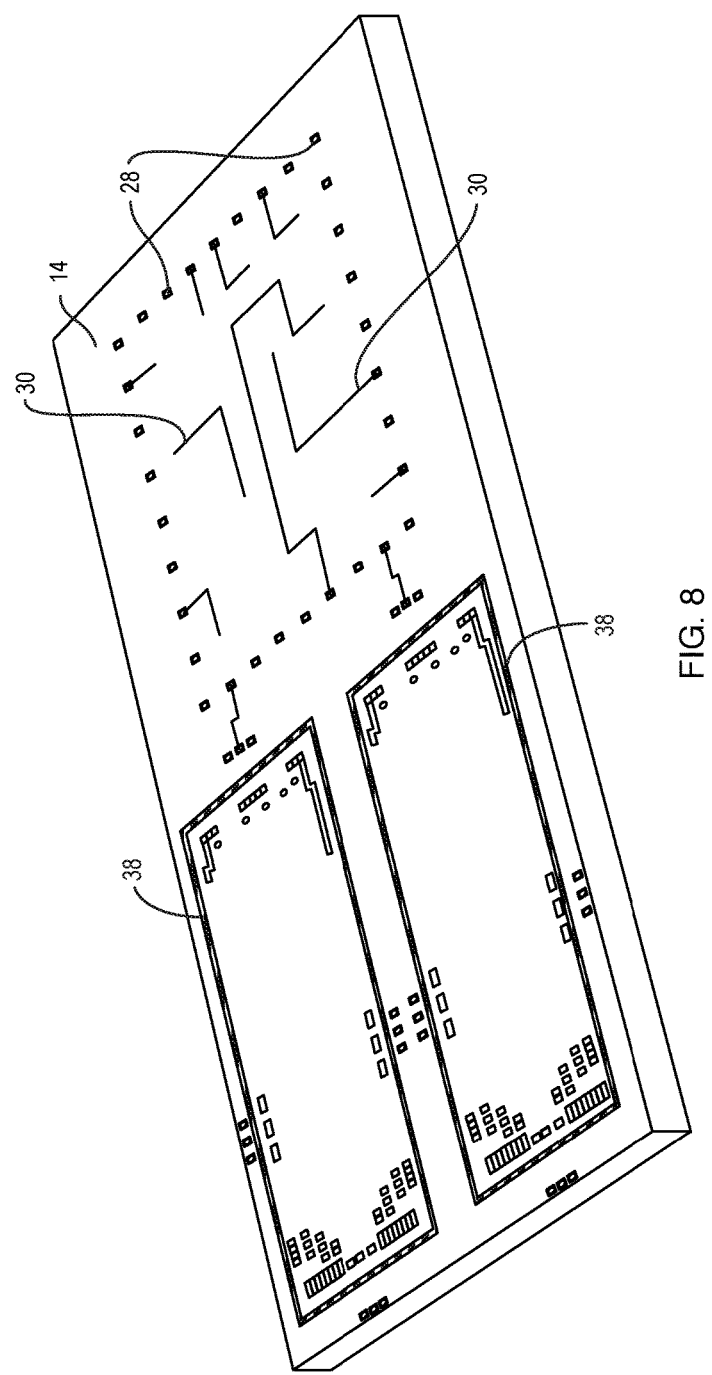
Figure 9:
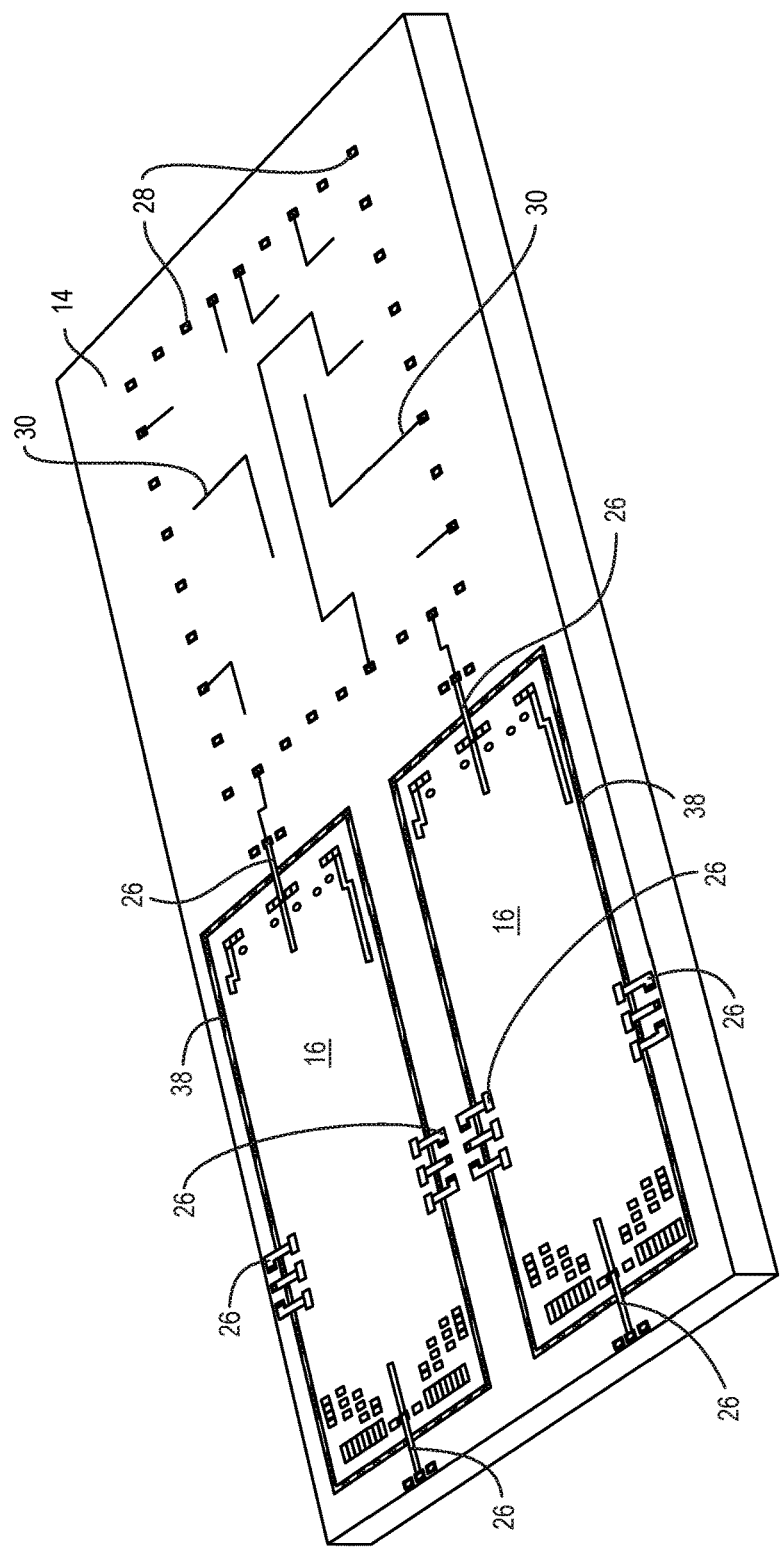

In the next step, the gaps 36 are filled with an appropriate material, which is referred to herein as a gap filler 38, as illustrated in FIG. 8. In one embodiment, the gap filler 38 is a suitable photosensitive polymer, such as BCB or a polyimide, which can be applied by a spin coat process, wherein after being spun, the gaps 36 are filled and the top surface of the gap filler 38 is planarized and made relatively level or flush with the top surface of the adapter substrate 14 and/or the top surfaces of the recessed dies 16. In one embodiment, the top surfaces of the recessed dies 16, the adapter substrate 14, and the gap filler 38 are essentially flush with one another, where flush is defined as the top surfaces being within 20 microns of each other. Other dispensing techniques may be applied. The goals of the gap filler 38 are to fill the gaps 36, provide mechanical support for the recessed dies 16, and provide a planar surface for the subsequent application of the chip-to-chip interconnects 26. As illustrated in FIG. 9, the chip-to-chip interconnects 26 are formed after the gap filler 38 is in place. The chip-to-chip interconnects 26 may be formed using an appropriate electroplating process or the like, as described above. Bond wires formed from a wire bonding process may be provided instead of the chip-to-chip interconnects 26; however, bond wires have vulnerabilities in high frequency applications, as the bond wires often act like antennas that inject noise into the signal paths provided by the bond wires.

Figure 10A:
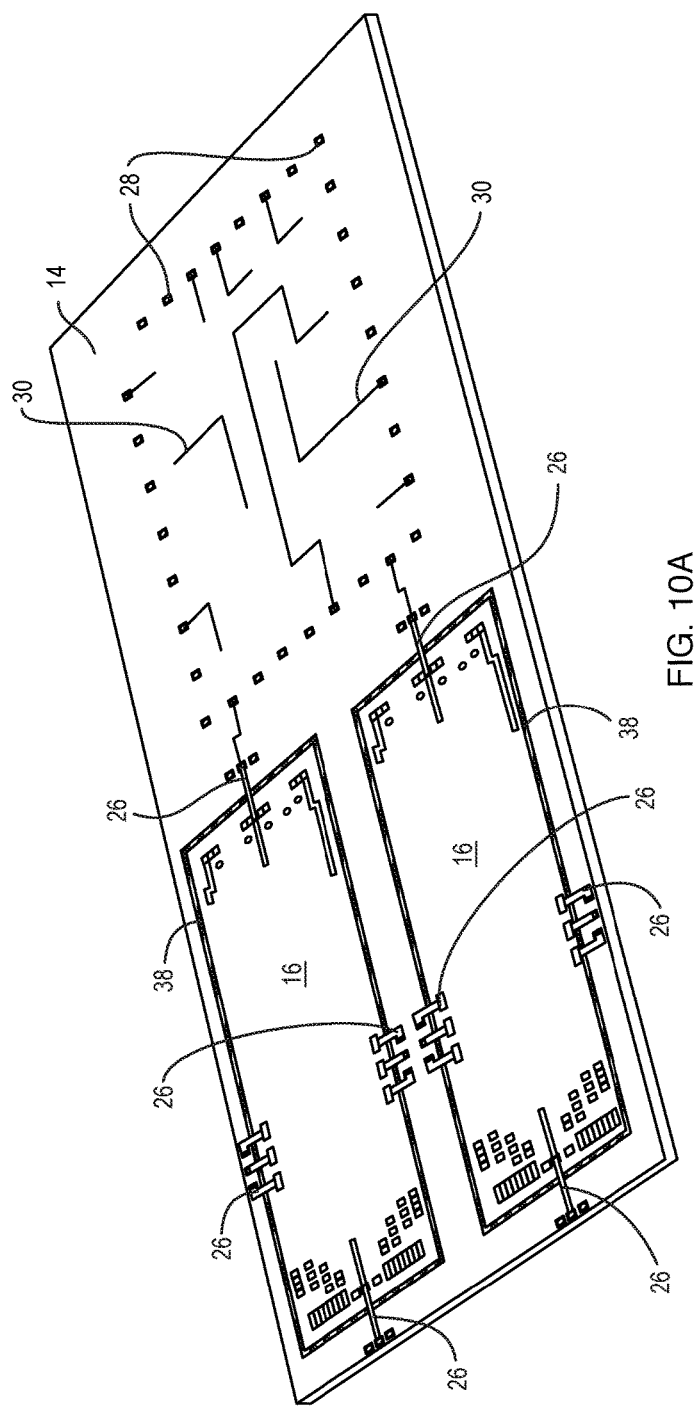
Figure 10B:
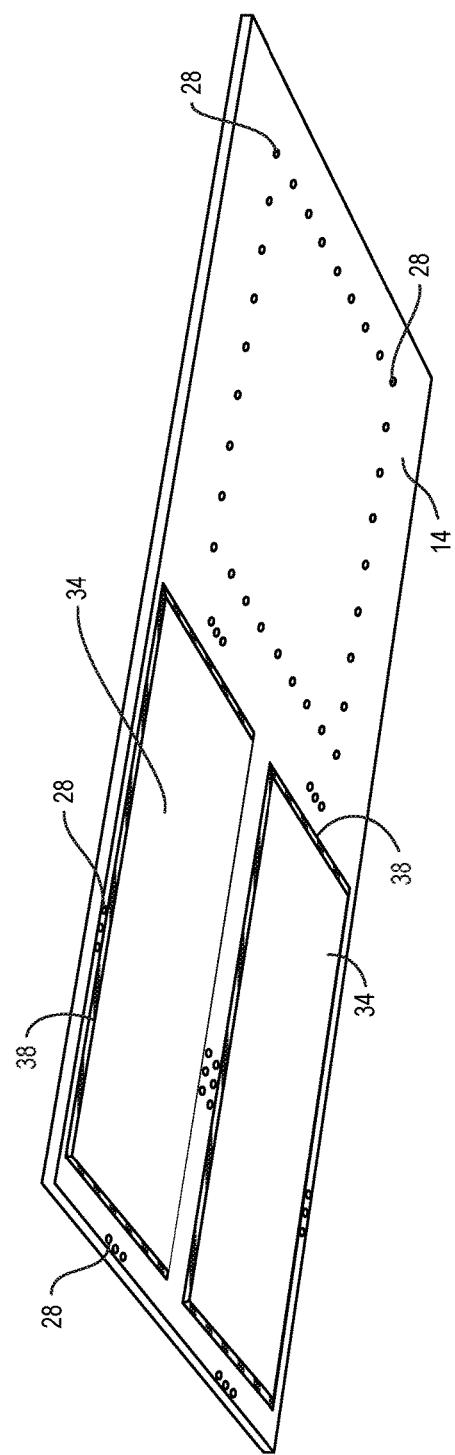
Figure 10C:
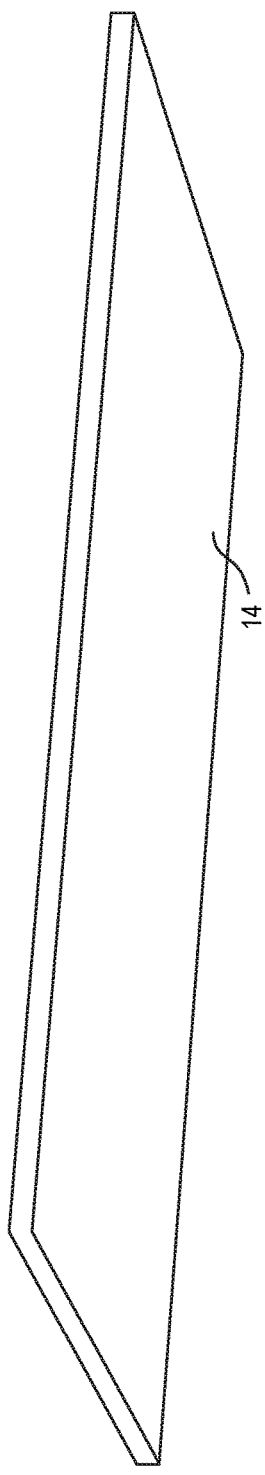

Once the chip-to-chip interconnects 26 are in place, the backside of the adapter substrate 14 (adapter wafer) is thinned using an appropriate mechanical grinding or etching process. FIG. 10A is a top isometric view of a thinned adapter substrate 14, and FIG. 10B shows the backside of the thinned adapter substrate 14. Notably, the thinning process exposes the metallization layer 34 and the partial vias 28 on the backside of the thinned adapter substrate 14. In certain embodiments, the thinning process stops prior to exposing the metallization layer 34 and/or the partial vias 28, as illustrated in FIG. 10C. Limiting the thinning in such a manner may be beneficial for especially high power devices that need the additional thermal conductivity and spreading provided by the material, such as silicon carbide, used to form the adapter substrate 14. However, additional processing may be necessary as illustrated in FIG. 10D.

Figure 10D:
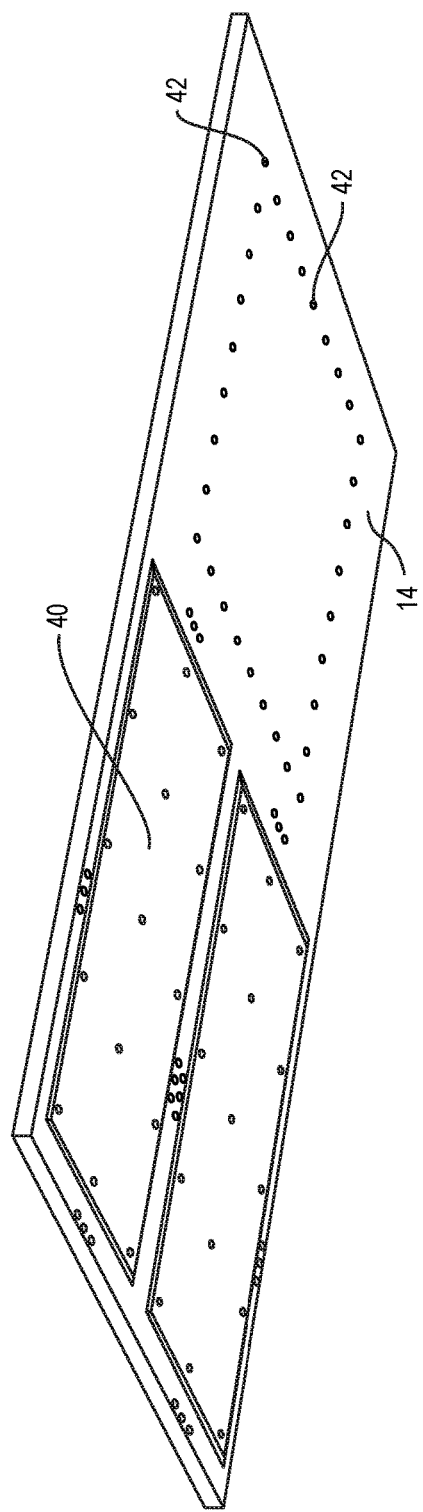

In FIG. 10D, a backside metal later 40 may be formed opposite the cavities 32 on the backside of the adapter substrate 14 to provide an electrically conductive path for ground or other signals beneath the recessed dies 16. A thin layer of the adapter substrate 14 remains between the backside metal layer 40 and the metallization layer 34. Similarly, backside partial vias 42, which align with and connect to the partial vias 28, may be formed in the backside of the adapter substrate 14. Additional vias are used to connect the backside metal layer 40 and the metallization layer 34.

Figure 11:
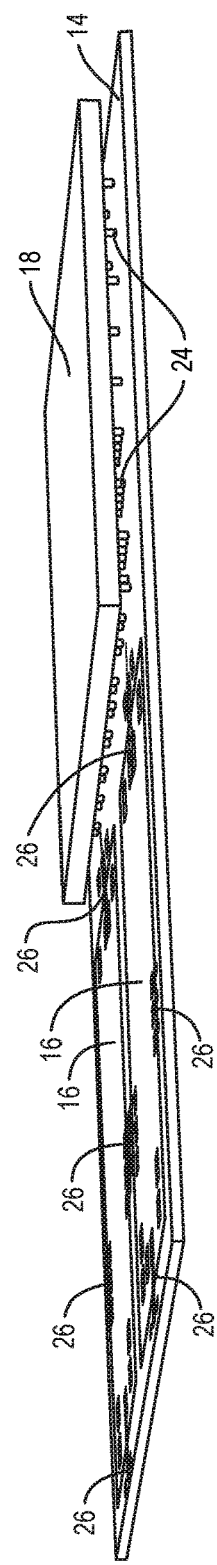

Next, the surface mounted die 18 is attached to the top side of the adapter substrate 14 using an appropriate surface mount attachment process (micro bump interconnects 24), as illustrated in FIG. 11. The surface mounted die 18 is illustrated as a flipped die, and this step may be provided in a wafer-level process before dicing or in a die-level process after dicing, as will be appreciated by those skilled in the art.

Figure 12A:
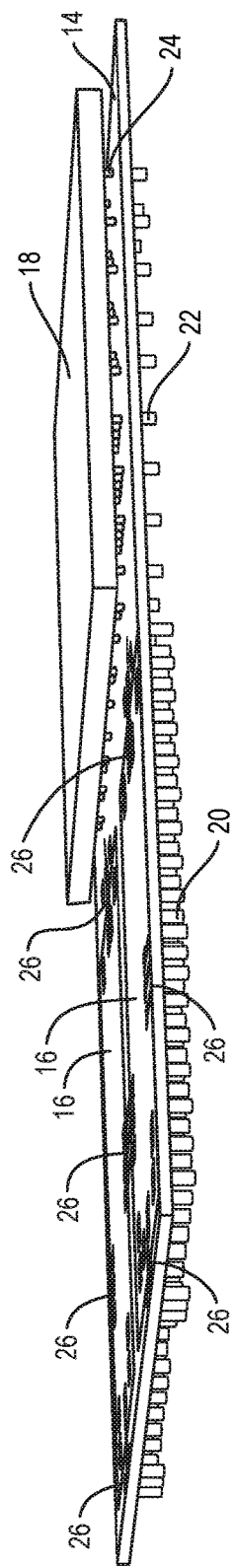
Figure 12B:
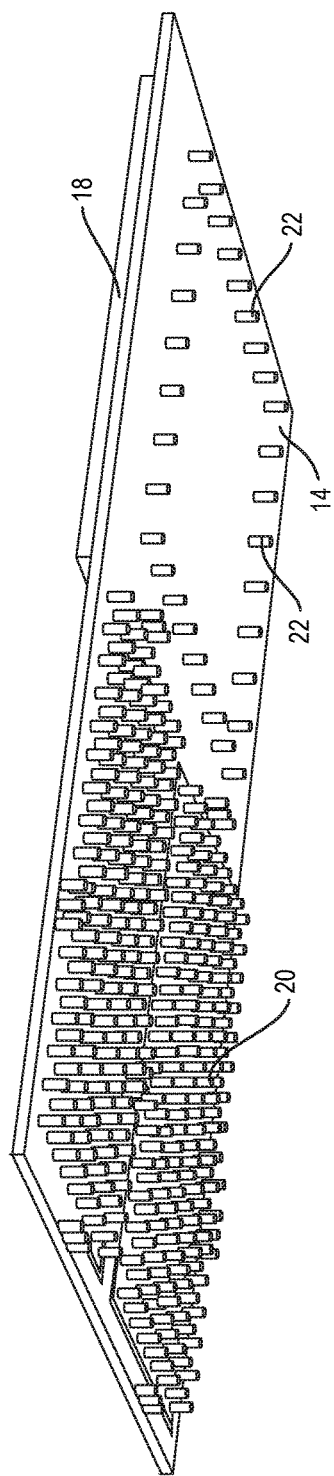

After a dicing process (not shown) to singulate the wafer to provide the adapter substrate 14, high and/or low density interconnects 20, 22 are formed on the exposed partial vias 28 and metallization layer 34 or the backside partial vias 42 and backside layer 40, depending on the extent of thinning for the adapter substrate 14, as illustrated in FIGS. 12A and 12B. Generally, the high density interconnects 20 are used in those areas beneath the higher power components, which in this case are the recessed dies 16. The high density interconnects 20 facilitate greater heat dissipation from the recessed dies 16 and adapter substrate 14 to the packaging substrate 12. The high density interconnects 20 will have a greater concentration of interconnects per unit area than the low density interconnects 22. A particularly beneficial combination of materials includes gallium nitride-based recessed dies 16 and a silicon carbide-based adapter substrate 14, wherein the surface mounted die 18 is based on yet another semiconductor material system, such as silicon, gallium arsenide, or the like.

Figure 13A:
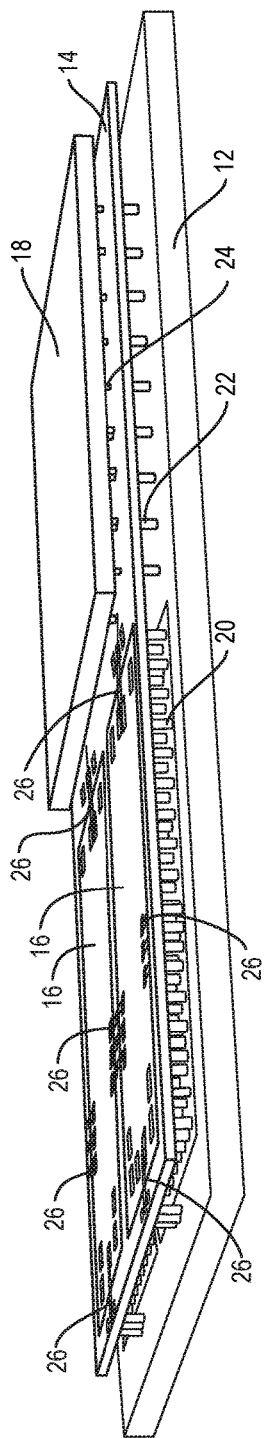
Figure 13B:
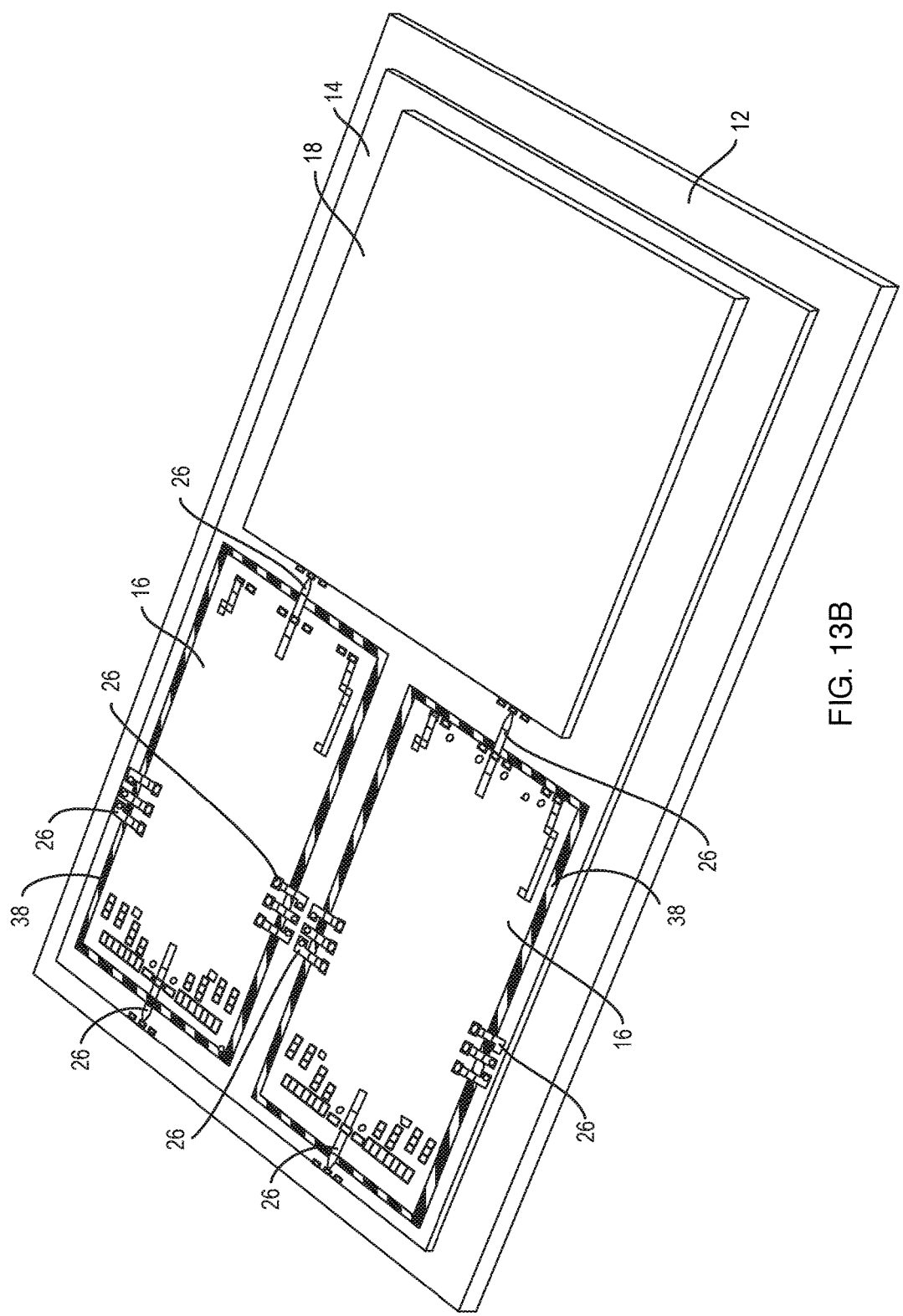

Finally, the adapter substrate 14 is coupled to a complementary packaging substrate 12, as illustrated in FIGS. 13A and 13B, using the high and low density interconnects 20, 22. As those skilled in the art will appreciate, each of the recessed dies 16, surface mounted die 18, adapter substrate 14, and packaging substrate 12 will have the requisite traces, vias, and interconnects to facilitate the connections necessary for the proper operation of the circuitry implemented in the various components and the module assembly 10 as a whole.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
   providing an adapter substrate having a backside surface and a top surface opposite the backside surface;
   forming partial vias that extend partially into the adapter substrate from the top surface of the adapter substrate;
   forming a first cavity that extends partially into the adapter substrate from the top surface, the first cavity having a first bottom surface and at least one first side wall;
   forming surface traces on the top surface of the adapter substrate, wherein at least one of the partial vias is electrically connected to at least one other of the partial vias;
   forming a first metallization layer on the first bottom surface of the first cavity;
   attaching a first recessed die to the first metallization layer such that the first recessed die is at least partially recessed into the first cavity, wherein a gap is formed between side portions of the first recessed die and the at least one first side wall;
   filling the gap with a gap filler such that a top surface of the gap filler is flush with the top surface of the adapter substrate and a top surface of the first recessed die;
   forming chip-to-chip interconnects over the top surface of the gap filler and between the top surface of the first recessed die and at least one of the surface traces or at least one of the partial vias to facilitate at least one electrical connection between the first recessed die and the at least one of the surface traces or the at least one of the partial vias on the adapter substrate;
   thinning the adapter substrate from the backside surface of the adapter substrate; and
   attaching a surface mounted die to the top surface of the adapter substrate.

2. The method of claim 1 further comprising:
   forming interconnects on the backside surface of the adapter substrate; and connecting the adapter substrate to a top surface of a packaging substrate using the interconnects.

3. The method of claim 1 further comprising:
forming interconnects on the backside surface of the adapter substrate, wherein at least a first of the interconnects electrically contacts at least one of the partial vias and at least a second of the interconnects electrically contacts the first metallization layer; and
connecting the adapter substrate to a top surface of a packaging substrate via the interconnects.

4. The method of claim 1 wherein thinning the adapter substrate from the backside surface comprises thinning the adapter substrate sufficiently to expose at least a portion of the first metallization layer and the partial vias.

5. The method of claim 4 further comprise forming interconnects on the backside surface of the adapter substrate, wherein at least a first of the interconnects directly contacts at least one of the partial vias and at least a second of the interconnects directly connects to an exposed portion of the first metallization layer.

6. The method of claim 5 wherein a density of the interconnects below the first metallization layer is higher than a density of the interconnects below the partial vias.

7. The method of claim 1 wherein thinning the adapter substrate from the backside surface comprises thinning the adapter substrate so as not to expose any portion of the first metallization layer or the partial vias.

8. The method of claim 7 further comprising forming a backside metallization layer on the backside surface of the adapter substrate opposite the first metallization layer.

9. The method of claim 8 further comprising forming backside partial vias on the backside surface of the adapter substrate opposite to and directly contacting at least some of the partial vias.

10. The method of claim 9 further comprising forming interconnects on the backside metallization layer and the backside surface of the adapter substrate, wherein at least a first of the interconnects directly contacts the backside metallization layer and at least a second of the interconnects is coupled to at least one of the backside partial vias.

11. The method of claim 10 wherein a density of the interconnects below the backside metallization layer is higher than a density of the interconnects below the partial vias.

12. The method of claim 1 wherein the adapter substrate is formed from a first semiconductor material system and the first recessed die is formed from a second semiconductor material system, which is different from the first semiconductor material system.

13. The method of claim 12 wherein the first semiconductor material system is silicon carbide and the second semiconductor material system is gallium nitride.

14. The method of claim 12 wherein the first semiconductor material system is silicon carbide.

15. The method of claim 14 wherein the second semiconductor material system is at least one of gallium arsenide and gallium nitride.

16. The method of claim 13 wherein the surface mounted die is formed from a third semiconductor material system, which is different from the first semiconductor material system and the second semiconductor material system.

17. The method of claim 16 wherein the first semiconductor material system is silicon carbide and the second semiconductor material system is at least one of gallium arsenide and gallium nitride.

18. The method of claim 17 wherein the third semiconductor material system is silicon.

19. The method of claim 1 wherein the adapter substrate is not formed from a semiconductor material system.

20. The method of claim 1 where in the gap filler is a polymer.

21. The method of claim 1 wherein the first metallization layer is a continuous pad that covers at least 80% of the first bottom surface of the first cavity.

22. The method of claim 1 wherein the first metallization layer is a continuous pad that covers an entirety of the first bottom surface of the first cavity.

23. A method comprising:
providing an adapter substrate having a backside surface and a top surface opposite the backside surface;
forming partial vias that extend partially into the adapter substrate from the top surface;
forming a first cavity that extends partially into the adapter substrate from the top surface, the first cavity having a first bottom surface and at least one first side wall;
forming surface traces on the top surface of the adapter substrate, wherein at least one of the partial vias is electrically connected to at least one other of the partial vias; each
forming a first metallization layer on the first bottom surface of the first cavity;
attaching a first recessed die to the first metallization layer such that the first recessed die is at least partially recessed into the first cavity, wherein a gap is formed between side portions of the first recessed die and the at least one first side wall;
filling the gap with a gap filler such that a top surface of the gap filler is flush with the top surface of the adapter substrate and a top surface of the first recessed die;
forming chip-to-chip interconnects over the top surface of the gap filler and between the top surface of the first recessed die and at least one of the surface traces or at least one of the partial vias to facilitate at least one electrical connection between the first recessed die and the at least one of the surface traces or the at least one of the partial vias on the adapter substrate;
thinning the adapter substrate from the backside surface of the adapter substrate;
attaching a surface mounted die to the top surface of the adapter substrate;
forming interconnects on the backside surface of the adapter substrate, wherein at least a first of the interconnects directly contacts at least one of the partial vias and at least a second of the interconnects directly contacts the first metallization layer; and
connecting the adapter substrate to a top surface of a packaging substrate via the interconnects.

* * * * *